(12) United States Patent
Kim

(10) Patent No.: US 7,259,105 B2
(45) Date of Patent: Aug. 21, 2007

(54) METHODS OF FABRICATING GATE SPACERS FOR SEMICONDUCTOR DEVICES

(75) Inventor: In Su Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 304 days.

(21) Appl. No.: 11/026,937

(22) Filed: Dec. 30, 2004

(65) Prior Publication Data

US 2005/0142783 A1    Jun. 30, 2005

(30) Foreign Application Priority Data

Dec. 31, 2003    (KR) ............. 10-2003-0102078

(51) Int. Cl.
*H01L 21/302*    (2006.01)
(52) U.S. Cl. ................ 438/724; 257/E21.31
(58) Field of Classification Search ........ 438/706, 438/707, 717, 723, 724; 257/E21.01, E21.33, 257/E21.038, E21.222, E21.244, E21.252, 257/E21.292, E21.31
See application file for complete search history.

(56) References Cited

U.S. PATENT DOCUMENTS

| | | | |
|---|---|---|---|
| 5,953,615 A | 9/1999 | Yu | |
| 6,015,747 A | 1/2000 | Lopatin et al. | |
| 6,194,279 B1 | 2/2001 | Chen et al. | |
| 6,207,544 B1 * | 3/2001 | Nguyen et al. | 438/595 |
| 6,277,700 B1 * | 8/2001 | Yu et al. | 438/303 |
| 2002/0003126 A1 * | 1/2002 | Kumar et al. | 216/67 |
| 2004/0089632 A1 * | 5/2004 | Park et al. | 216/71 |
| 2005/0277250 A1 * | 12/2005 | Pan et al. | 438/257 |
| 2005/0284576 A1 * | 12/2005 | America et al. | 156/345.43 |

* cited by examiner

*Primary Examiner*—W. David Coleman
(74) *Attorney, Agent, or Firm*—Saliwanchik, Lloyd & Saliwanchik

(57) ABSTRACT

A method of fabricating the gate spacers of semiconductor devices is disclosed. An example method forms a gate on a semiconductor substrate, deposits a buffer oxide layer and a nitride layer sequentially on the whole semiconductor substrate including the gate, and forms spacers by etching the nitride layer.

5 Claims, 1 Drawing Sheet

METHODS OF FABRICATING GATE SPACERS FOR SEMICONDUCTOR DEVICES

TECHNICAL FIELD

The present disclosure relates to semiconductor devices and, more particularly, to a methods of fabricating gate spacers for semiconductor devices.

BACKGROUND

Known gate spacer fabrication methods are described below. First, an STI (shallow trench isolation) structure and a well are formed in a semiconductor substrate. Then, a gate oxide layer and a gate polysilicon layer are deposited and patterned to form a gate. Dopants of low concentration are then implanted by using the gate as a mask to form an LDD (lightly doped drain) region. A TEOS (tetra-ethoxysilane) layer and a nitride layer are deposited and etched through a dry etch process by using $CH_3F/CH_4$ gases to form gate spacers. Finally, source and drain regions are formed by implanting the ions of high concentration.

However, if CxFy gases are used for the dry etch, an etch selectivity of more than 3 between the oxide layer and the nitride layer is difficult to achieve. Thus, while the nitride layer for spacers is selectively etched, the oxide layer on a silicon substrate is unintentionally damaged, which results in exposure of the surface of a device active region to plasma. If the surface of the silicon substrate is exposed to plasma, the dopants of a well region are decreased and a photoresist is coated directly on the silicon substrate, which causes its contamination by organic materials. Furthermore, the effectiveness of the ion implantation to form the source and drain regions can be reduced due to the contamination by organic materials.

DETAILED DESCRIPTION

An ion implantation process to form an LDD region is performed after a gate is formed. The gate may be previously formed using any desired known technique(s). An LP-TEOS (low pressure TEOS) oxide layer and an SiN nitride layer are deposited in order to form gate spacers. In detail, the LP-TEOS oxide layer is formed with a thickness between 150 Å and 300 Å and the SiN layer is formed with a thickness between 700 Å and 1200 Å. The LP-TEOS oxide layer functions as a buffer oxide layer to enhance the adhesion of the nitride layer to compensate for the residual stress of polysilicon.

A dry etch is then performed by using a bias HDP (High Density Plasma) to form gate spacers. The conditions for the dry etch are as follows. $SF_6$ gas between 20 sccm and 100 sccm, HBr gas between 80 sccm and 200 sccm and $N_2$ gas between 0 and 20 sccm are used and a source power between 500 W and 1000 W and a bias power between 50 W and 100 W are applied for the dry etch. The high density plasma using gas mixtures of $SF_6/HBr/N_2$ has a better etch selectivity between an oxide layer and a nitride layer than CxFx gas, which has been employed in known methods and, thus, increases the etch selectivity to more than 10. The etch selectivity can also be adjusted by changing the amount of the $N_2$ gas or the source/bias powers.

Figure 1:
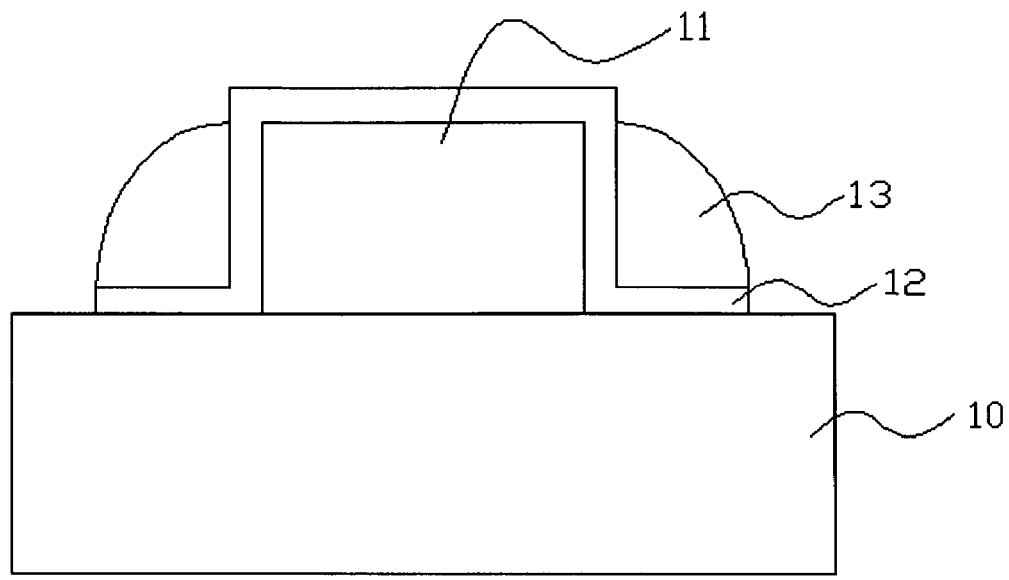
FIG. 1 and FIG. 2 are cross-sectional views illustrating example processes of fabricating gate spacers.
Figure 2:
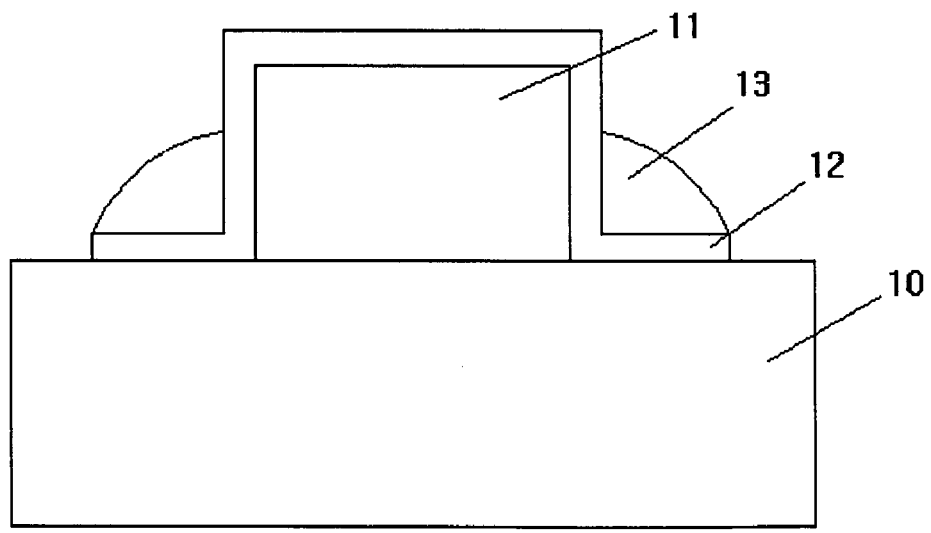

Referring to FIG. 1 and FIG. 2, the height of spacers depends on the type of a silicide material to be formed. Generally, silicide is formed by depositing a predetermined metal and performing a thermal treatment during which the metal and the silicon under the metal react with each other. The silicide is electrically conductive and formed on a source/drain region and a gate electrode to play the role of reducing their contact resistance to metal interconnects. However, as the devices are quickly getting highly integrated, the width of gates becomes narrower and the area on which the silicide is formed decreases, which increases the contact resistance.

Referring to FIG. 1, a gate 11 is formed on the semiconductor substrate 10, and spacers 13 comprising an LP-TEOS buffer oxide layer 12 and a nitride layer 13 are formed on the sidewalls of the gate 11. In this case, the heights of the spacers 13 and the gate electrode are the same. The spacers do not need to be etched lower than the gate electrode due to the characteristic of Co-silicide (i.e., when Co is used to form silicide). More specifically, because Co has lower specific resistance than metal materials used in connection with known processes, the silicide formed only on the gate is enough for low contact resistance. Thus, the height of the spacers doesn't need to be lowered to increase the contact area of the silicide.

In the case of forming the Co-silicide, the spacers are formed regardless of the etch selectivity of the TEOS layer and the nitride spacer. However, the silicon oxide layer on the source/drain region exposed to plasma during the formation of spacers should be considered. If the etch selectivity of the nitride layer to the oxide layer in a plasma process is not sufficiently high, the silicon oxide layer and the surface of the silicon in an active region are damaged. The example method described herein etches the spacers by using the plasma that has a high selectivity, thereby preventing the damage of the silicon substrate in the active region.

Referring to FIG. 2, silicide is formed by using Ti and the spacers are etched lower than the height of the gate electrode. Because the Ti-silicide has higher specific resistance than the Co-silicide, a wider contact area is needed. The lower the height of the spacers to be formed on the sidewalls of the gate relative to the gate, the bigger the silicide area to be formed and, thus, the contact resistance can be reduced. The area on which Co is deposited can be increased by forming a spacer which is 500 Å to 600 Å lower than the thickness of the gate electrode. Next, if the spacers are etched by using the plasma that has an etch selectivity of over 10 between the nitride layer and the oxide layer, the nitride spacers can be selectively removed without any damage to the TEOS oxide layer.

Accordingly, the disclosed methods use plasma having a good etch selectivity between an oxide layer and a nitride layer to etch nitride spacers, thereby preventing a silicon substrate from being exposed to the plasma. In addition, the illustrated methods etch spacers, with heights that depend on the type of a silicide material, at a high etch selectivity.

It is noted that this patent claims priority from Korean Patent Application Serial Number 10-2003-0102078, which was field on Dec. 31, 2003, and is hereby incorporated by reference in its entirety.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method of fabricating the gate spacers of semiconductor devices comprising:
    forming a gate on a semiconductor substrate;
    depositing a buffer oxide layer and a nitride layer sequentially on the whole semiconductor substrate including the gate; and
    forming spacers by etching the nitride layer using a high density plasma, wherein the high density plasma is made of gas mixtures of $HBr/SF_6/N_2$.

2. A method as defined by claim 1, wherein the buffer oxide layer is made of LP-TEOS with a thickness between 150 Å and 300 Å.

3. A method as defined by claim 1, wherein the nitride layer is made of SiN with a thickness between 700 Å and 1200 Å.

4. A method as defined by claim 1, wherein the nitride layer is etched by $SF_6$ gas between 20 sccm and 100 sccm. HBr gas between 80 sccm and 200 sccm and $N_2$ gas between 0 sccm and 20 sccm. a source power between 500 W and 1000 W and a bias power between 50 W and 100 W.

5. A method as defined by claim 4, wherein the amount of the $N_2$ gas and the source/bias power are adjusted depending on the etch selectivity between the nitride layer and the oxide layer.

* * * * *